United States Patent
Suzuki et al.

(10) Patent No.: US 8,289,701 B2
(45) Date of Patent: Oct. 16, 2012

(54) LIQUID COOLING UNIT AND HEAT RECEIVER THEREFOR

(75) Inventors: Masumi Suzuki, Kawasaki (JP);
Michimasa Aoki, Kawasaki (JP);
Yosuke Tsunoda, Kawasaki (JP);
Masuo Ohnishi, Kawasaki (JP);
Masahiko Hattori, Kawasaki (JP)

(73) Assignee: Fujistu Limited, Kawasaki (JP)

( * ) Notice: Subject to any disclaimer, the term of this patent is extended or adjusted under 35 U.S.C. 154(b) by 33 days.

(21) Appl. No.: 11/878,620

(22) Filed: Jul. 25, 2007

(65) Prior Publication Data

US 2008/0024988 A1 Jan. 31, 2008

(30) Foreign Application Priority Data

Jul. 25, 2006 (JP) ................................. 2006-202289

(51) Int. Cl.
*G06F 1/20* (2006.01)
*H05K 7/20* (2006.01)

(52) U.S. Cl. .............. 361/679.53; 361/679.55; 361/699; 361/701; 361/704; 361/709; 165/80.4; 165/80.5; 165/104.33; 165/185

(58) Field of Classification Search ............. 361/679.46, 361/679.53–679.55, 699, 702–704, 719; 165/80.4, 104.33, 185, 80.5
See application file for complete search history.

(56) References Cited

U.S. PATENT DOCUMENTS

| | | | |
|---|---|---|---|
| 4,381,032 A | * | 4/1983 | Cutchaw ........................ 165/46 |
| 4,531,146 A | * | 7/1985 | Cutchaw ....................... 257/713 |
| 4,612,978 A | * | 9/1986 | Cutchaw ................... 165/104.33 |
| 4,698,728 A | | 10/1987 | Tustaniqskyj et al. |
| 4,730,665 A | * | 3/1988 | Cutchaw ....................... 165/80.4 |
| 4,884,168 A | * | 11/1989 | August et al. ................. 361/702 |
| 4,884,169 A | * | 11/1989 | Cutchaw ....................... 361/700 |
| 5,016,090 A | | 5/1991 | Galyon et al. |
| 5,021,924 A | * | 6/1991 | Kieda et al. ................... 361/699 |
| 5,043,797 A | | 8/1991 | Lopes |
| 5,079,619 A | | 1/1992 | Davidson |
| 5,205,348 A | * | 4/1993 | Tousignant et al. ............. 165/46 |
| 5,285,347 A | | 2/1994 | Fox et al. |

(Continued)

FOREIGN PATENT DOCUMENTS

CN 1610009 4/2005

(Continued)

OTHER PUBLICATIONS

Office Action mailed on May 26, 2008 and issued in corresponding Korean Patent Application No. 10-2007-0074557.

(Continued)

*Primary Examiner* — Robert J Hoffberg
(74) *Attorney, Agent, or Firm* — Staas & Halsey LLP

(57) ABSTRACT

A heat receiver includes a casing defining a flow passage on a thermal conductive plate. The thermal conductive plate is received on an electronic component. The thermal conductive plate serves to transfer heat to coolant in the flow passage. At least two inflow nozzles extend into the casing to have discharge openings opposed to the upstream end of the flow passage. The coolant flows into the flow passage through the inflow nozzles. At least two streams of the coolant are thus generated in the flow passage. The streams widely expand or spread in the flow passage. The coolant flows through the flow passage without stagnating. The coolant can thus absorb the heat of the thermal conductive plate in an efficient manner. This results in an efficient heat absorption of the heat receiver.

18 Claims, 12 Drawing Sheets

U.S. PATENT DOCUMENTS

| | | |
|---|---|---|
| 5,316,075 A | 5/1994 | Quon et al. |
| 5,323,847 A | 6/1994 | Koizumi et al. |
| 5,349,831 A * | 9/1994 | Daikoku et al. ............... 62/376 |
| 5,473,508 A | 12/1995 | Porter et al. |
| 5,606,341 A * | 2/1997 | Aguilera ........................ 345/87 |
| 5,634,351 A | 6/1997 | Larson et al. |
| 5,859,763 A * | 1/1999 | Nam et al. .................... 361/699 |
| 6,005,772 A | 12/1999 | Terao et al. |
| 6,052,284 A * | 4/2000 | Suga et al. .................... 361/699 |
| 6,111,749 A | 8/2000 | Lamb et al. |
| 6,152,213 A | 11/2000 | Suzuki |
| 6,166,907 A | 12/2000 | Chien |
| 6,173,758 B1 * | 1/2001 | Ward et al. ................... 165/80.3 |
| 6,313,990 B1 | 11/2001 | Cheon |
| 6,360,814 B1 | 3/2002 | Tanaka et al. |
| 6,510,052 B2 | 1/2003 | Ishikawa et al. |
| 6,519,147 B2 | 2/2003 | Nakagawa et al. |
| 6,519,148 B2 | 2/2003 | Nakagawa et al. |
| 6,587,345 B2 * | 7/2003 | Chu et al. ..................... 361/719 |
| 6,588,647 B2 | 7/2003 | Yamada et al. |
| 6,651,735 B2 * | 11/2003 | Cho et al. ................. 165/104.26 |
| 6,728,102 B2 | 4/2004 | Ishikawa et al. |
| 6,751,095 B2 | 6/2004 | Ishikawa et al. |
| 6,763,880 B1 | 7/2004 | Shih |
| 6,791,834 B2 | 9/2004 | Nakagawa et al. |
| 6,809,927 B2 | 10/2004 | Ohashi et al. |
| 6,832,646 B1 | 12/2004 | Uomori et al. |
| 6,839,234 B2 | 1/2005 | Niwatsukino et al. |
| 6,867,973 B2 | 3/2005 | Chang |
| 6,920,043 B1 | 7/2005 | Ishikawa et al. |
| 7,044,198 B2 | 5/2006 | Matsushima et al. |
| 7,143,815 B2 * | 12/2006 | Lee et al. ..................... 165/80.4 |
| 7,212,405 B2 * | 5/2007 | Prasher et ..................... 361/699 |
| 7,352,581 B2 | 4/2008 | Tomioka |
| 7,355,852 B2 | 4/2008 | Pfahnl |
| 7,371,056 B2 | 5/2008 | Ito et al. |
| 7,372,698 B1 | 5/2008 | Tilton et al. |
| 7,417,857 B2 * | 8/2008 | Rondier et al. ............... 361/699 |
| 7,508,672 B2 | 3/2009 | Hamman |
| 7,516,776 B2 * | 4/2009 | Bezama et al. .............. 165/80.4 |
| 7,547,966 B2 * | 6/2009 | Funakoshi et al. ........... 257/707 |
| 8,050,036 B2 * | 11/2011 | Suzuki et al. ................ 361/699 |
| 2002/0039279 A1 | 4/2002 | Ishikawa et al. |
| 2002/0075643 A1 | 6/2002 | Nakagawa et al. |
| 2002/0101716 A1 | 8/2002 | Nakagawa et al. |
| 2002/0117291 A1 | 8/2002 | Cheon |
| 2003/0053294 A1 | 3/2003 | Yamada et al. |
| 2003/0075308 A1 | 4/2003 | Abiko et al. |
| 2003/0081380 A1 | 5/2003 | Nakagawa et al. |
| 2003/0151892 A1 | 8/2003 | Kondo et al. |
| 2004/0037035 A1 * | 2/2004 | Ohashi et al. ................. 361/687 |
| 2004/0042184 A1 | 3/2004 | Tomioka |
| 2004/0057207 A1 | 3/2004 | Ishikawa et al. |
| 2004/0190250 A1 | 9/2004 | Iijima et al. |
| 2004/0250992 A1 | 12/2004 | Aoki et al. |
| 2005/0007730 A1 | 1/2005 | Ohashi et al. |
| 2005/0067066 A1 | 3/2005 | Tanaka et al. |
| 2005/0078450 A1 | 4/2005 | Ohashi et al. |
| 2005/0081534 A1 | 4/2005 | Suzuki et al. |
| 2005/0178529 A1 | 8/2005 | Suzuki |
| 2005/0180105 A1 | 8/2005 | Matsushima et al. |
| 2005/0180106 A1 | 8/2005 | Ohashi et al. |
| 2005/0180108 A1 | 8/2005 | Kondo et al. |
| 2005/0211421 A1 | 9/2005 | Ekelund et al. |
| 2005/0230083 A1 | 10/2005 | Hsieh |
| 2005/0243510 A1 | 11/2005 | Tomioka et al. |
| 2005/0243511 A1 | 11/2005 | Hata et al. |
| 2005/0264997 A1 * | 12/2005 | Prasher et al. ............... 361/699 |
| 2005/0280995 A1 | 12/2005 | Iijima et al. |
| 2006/0005953 A1 * | 1/2006 | Lee et al. ................. 165/104.33 |
| 2006/0016584 A1 | 1/2006 | Sanatgar et al. |
| 2006/0023421 A1 | 2/2006 | Hata et al. |
| 2006/0023425 A1 | 2/2006 | Iijima et al. |
| 2006/0096743 A1 * | 5/2006 | Lee et al. ................. 165/104.33 |
| 2006/0176665 A1 | 8/2006 | Matsushima et al. |
| 2006/0187640 A1 | 8/2006 | Tomioka et al. |
| 2006/0243422 A1 * | 11/2006 | Sakai et al. ................... 165/80.4 |
| 2006/0260784 A1 * | 11/2006 | Bezama et al. .............. 165/80.2 |
| 2007/0062681 A1 | 3/2007 | Beech |
| 2007/0070604 A1 | 3/2007 | Tomioka et al. |
| 2007/0107873 A1 * | 5/2007 | Peng ............................ 165/80.4 |
| 2007/0107874 A1 * | 5/2007 | Peng ............................ 165/80.4 |
| 2007/0119569 A1 | 5/2007 | Cambell et al. |
| 2007/0175610 A1 | 8/2007 | Yeh |
| 2007/0295481 A1 | 12/2007 | Campbell et al. |
| 2008/0164014 A1 | 7/2008 | Nakamura |

FOREIGN PATENT DOCUMENTS

| | | |
|---|---|---|
| CN | 1656352 | 8/2005 |
| CN | 1658122 A | 8/2005 |
| CN | 1976572 | 6/2007 |
| DE | 20 2004 007 907 U1 | 10/2004 |
| EP | 1 564 626 A1 | 8/2005 |
| EP | 1 564 809 | 8/2005 |
| EP | 1 564 809 A1 | 8/2005 |
| EP | 1591872 A2 | 11/2005 |
| JP | 58-22746 | 8/1956 |
| JP | 56-67949 | 6/1981 |
| JP | 62-139346 | 6/1987 |
| JP | 02301616 A * | 12/1990 |
| JP | 4-133497 | 5/1992 |
| JP | 4-221843 | 8/1992 |
| JP | 5-149688 | 6/1993 |
| JP | 7-224658 | 8/1995 |
| JP | 8-152206 | 6/1996 |
| JP | 8-159615 | 6/1996 |
| JP | 2000-45772 | 2/2000 |
| JP | 2001-24126 | 1/2001 |
| JP | 2001-358270 | 12/2001 |
| JP | 2002-99356 | 4/2002 |
| JP | 2002182797 | 6/2002 |
| JP | 2003-47258 | 2/2003 |
| JP | 2003-161547 | 6/2003 |
| JP | 2004-251474 | 9/2004 |
| JP | 2004-293833 | 10/2004 |
| JP | 2004-303268 | 10/2004 |
| JP | 2004-304076 | 10/2004 |
| JP | 2005-011983 | 1/2005 |
| JP | 2005-19760 | 1/2005 |
| JP | 2005-077012 | 3/2005 |
| JP | 2005-79337 | 3/2005 |
| JP | 2005-166855 | 6/2005 |
| JP | 2005-229003 | 8/2005 |
| JP | 2005-229033 | 8/2005 |
| JP | 2005-317798 | 11/2005 |
| JP | 2005-317877 | 11/2005 |
| JP | 2006-66509 | 3/2006 |
| JP | 2006066509 | 3/2006 |
| KR | 10-2004-0101275 | 12/2004 |
| WO | WO 9946544 A1 * | 9/1999 |
| WO | 2005-043621 | 5/2005 |
| WO | WO 2005043621 A1 * | 5/2005 |

OTHER PUBLICATIONS

European Search Report issued in corresponding European Patent Application No. 07113051.2-2214 on Nov. 30, 2007.
Office Action mailed Feb. 27, 2009; U.S. Appl. No. 11/878,613.
Office Action mailed Jun. 9, 2009; U.S. Appl. No. 11/878,613.
Office Action mailed May 18, 2009; U.S. Appl. No. 11/878,621.
Office Action mailed Mar. 10, 2009; U.S. Appl. No. 11/878,614.
Office Action mailed Mar. 2, 2009; U.S. Appl. No. 11/878,615.
Office Action mailed Mar. 11, 2009; U.S. Appl. No. 11/878,616.
Korean Office Action issued on Nov. 27, 2008 in corresponding Korean Patent Application No. 10-2007-0074562.
Korean Office Action issued on Nov. 26, 2008 in corresponding Korean Patent Application No. 10-2007-0074559.
Summons to Attend Oral Proceedings issued Nov. 21, 2008 in corresponding European Patent Application No. 07113060.3.
Chinese Patent Office Action, mailed Jul. 31, 2009 and issued in corresponding Chinese Patent Application No. 200710139094.
Chinese Patent Office Action, mailed Jul. 31, 2009 and issued in Chinese Patent Application No. 200710139097.4 corresponding to related U.S. Appl. No. 11/878,613.
Notice of Allowance mailed Sep. 14, 2009 in related U.S. Appl. No. 11/878,616.

Notice of Allowance mailed Sep. 14, 2009 in related U.S. Appl. No. 11/878,614.

Notice of Allowance mailed Sep. 4, 2009 in related U.S. Appl. No. 11/878,615.

Office Communication mailed Oct. 7, 2009 in related U.S. Appl. No. 11/878,615.

Office Communication mailed Oct. 7, 2009 in related U.S. Appl. No. 11/878,616.

Communication issued by the European Patent Office on Nov. 5, 2010 in the related European patent application No. 07113057.9.

Communication issued by the European Patent Office on Nov. 5, 2010 in the related European patent application No. 07113054.6.

U.S. Appl. No. 11/878,613, filed Jul. 25, 2007, Masumi Suzuki et al., Fujitsu Limited.

U.S. Appl. No. 11/878,614, filed Jul. 25, 2007, Masumi Suzuki et al., Fujitsu Limited.

U.S. Appl. No. 11/878,615, filed Jul. 25, 2007, Masumi Suzuki et al., Fujitsu Limited.

U.S. Appl. No. 11/878,616, filed Jul. 25, 2007, Masumi Suzuki et al., Fujitsu Limited.

Communication issued by the Japanese Patent Office on Dec. 7, 2010 in the related Japanese patent application No. 2006-202286.

Communication issued by the Japanese Patent Office on Dec. 14, 2010 in the related Japanese patent application No. 2006-202288.

Communication issued by the Japanese Patent Office on Dec. 14, 2010 in the related Japanese patent application No. 2006-202289.

Communication mailed by the Japanese Patent Office on Mar. 22, 2011 in the related Japanese patent application No. 2006-202289.

U.S. Appl. No. 11/878,619, filed Jul. 25, 2007, Masumi Suzuki et al., Fujitsu Limited.

U.S. Appl. No. 11/878,621, filed Jul. 25, 2007, Masumi Suzuki et al., Fujitsu Limited.

Japanese Office Action in corresponding Japanese Application No. 2006-202289 dated Apr. 18, 2012.

Office Action mailed from the U.S. Patent and Trademark Office on Aug. 6, 2012 in the related U.S. Appl. No. 11/878,619.

* cited by examiner

LIQUID COOLING UNIT AND HEAT RECEIVER THEREFOR

BACKGROUND OF THE INVENTION

1. Field of the Invention

The present invention relates to a liquid cooling unit incorporated in an electronic apparatus such as a notebook personal computer, for example.

2. Description of the Prior Art

A liquid cooling unit includes a heat receiver such as a liquid cooling jacket as disclosed in Japanese Patent Application Publication No. 2005-229033, for example. The heat receiver includes a casing defining a flow passage on a flat thermal conductive plate. A single inflow nozzle is coupled to the upstream end of the flow passage. A single outflow nozzle is also coupled to the downstream end of the flow passage. Coolant thus flows through the flow passage from the inflow nozzle to the outflow nozzle.

The coolant flows into the flow passage through the single inflow nozzle. The stream of the coolant is generated on the extension of the inflow nozzle. The inflow nozzle is considerably narrower than the flow passage, so that the coolant stagnates at a position off the extension of the inflow nozzle. Heat cannot be transferred to the coolant from the thermal conductive plate in an efficient manner.

SUMMARY OF THE INVENTION

It is accordingly an object of the present invention to provide a heat receiver for a liquid cooling unit, a liquid cooling unit, and an electronic apparatus, enabling an efficient heat transfer.

According to a first aspect of the present invention, there is provided a heat receiver for a liquid cooling unit, comprising: a casing defining a flow passage on a thermal conductive plate; at least two inflow nozzles extending into the casing along parallel lines, the inflow nozzles having discharge openings at the upstream end of the flow passage, respectively; and an outflow nozzle extending into the casing, the outflow nozzle having an inflow opening at the downstream end of the flow passage.

The heat receiver includes the casing defining the flow passage on the thermal conductive plate. The thermal conductive plate receives heat for transfer to the coolant in the flow passage. At least two inflow nozzles extend into the casing to have the discharge openings opposed to the upstream end of the flow passage. The coolant flows into the flow passage through the inflow nozzles. At least two streams of the coolant are thus generated in the flow passage. The streams widely expand or spread in the flow passage. The coolant flows through the flow passage without stagnating. The coolant can thus absorb the heat of the thermal conductive plate in an efficient manner. This results in an efficient heat absorption of the heat receiver.

The flow passage may extend on the extensions of the inflow nozzles in the heat receiver. The inflow nozzles and the outflow nozzle may be opposed to each other. Alternatively, the inflow nozzles and the outflow nozzle may be oriented in the same direction. The heat receiver may further comprise heat radiating fins standing from the thermal conductive plate. The individual heat radiating fin extends in the direction of the coolant flow. The heat radiating fins may be arranged in a zigzag pattern. Heat is transmitted from the thermal conductive plate to the heat radiating fins. Since the heat radiating fins are arranged in a zigzag pattern in the direction of the coolant flow, the flow passage can be established between the adjacent heat radiating fins in the direction of the coolant flow. The coolant can flow through the flow passage without stagnating. The flowing coolant absorbs the heat of the heat radiating fins. The heat radiation is accelerated in this manner.

According to a second aspect of the present invention, there is provided a liquid cooling unit comprising: a closed circulating loop; a heat receiver inserted in the closed circulating loop, the heat receiver having a thermal conductive plate received on an electronic component; and a heat exchanger inserted in the closed circulating loop so as to absorb heat from coolant, wherein the heat receiver includes: a casing defining a flow passage on the thermal conductive plate; at least two inflow nozzles extending into the casing along parallel lines, the inflow nozzles having discharge openings at the upstream end of the flow passage, respectively; and an outflow nozzle extending into the casing, the outflow nozzle having an inflow opening at the downstream end of the flow passage.

The liquid cooling unit enables an efficient absorption of heat to the coolant in the heat receiver in the same manner as described above. The coolant circulates through the closed circulating loop incorporating the heat receiver. The heat exchanger is inserted in the closed circulating loop. The heat exchanger absorbs the heat of the coolant. The coolant then flows into the heat receiver. The electronic component can thus be cooled in an efficient manner.

The flow passage may extend on the extensions of the inflow nozzles in the liquid cooling unit in the same manner as described above. The inflow nozzles and the outflow nozzle may be opposed to each other. Alternatively, the inflow nozzles and the outflow nozzle may be oriented in the same direction. The liquid cooling unit may further comprise heat radiating fins standing from the thermal conductive plate. The individual heat radiating fin extends in the direction of the coolant flow. The hear radiating fins may be arranged in a zigzag pattern.

The heat receiver and the liquid cooling unit can be incorporated in an electronic apparatus. The electronic apparatus may comprise: an electronic component; a closed circulating loop; a heat receiver inserted in the closed circulating loop, the heat receiver having a thermal conductive plate received on the electronic component; and a heat exchanger inserted in the closed circulating loop so as to absorb heat from coolant, wherein the heat receiver includes: a casing defining a flow passage on the thermal conductive plate; at least two inflow nozzles extending into the casing along parallel lines, the inflow nozzles having discharge openings at the upstream end of the flow passage, respectively; and an outflow nozzle extending into the casing, the outflow nozzle having an inflow opening at the downstream end of the flow passage.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
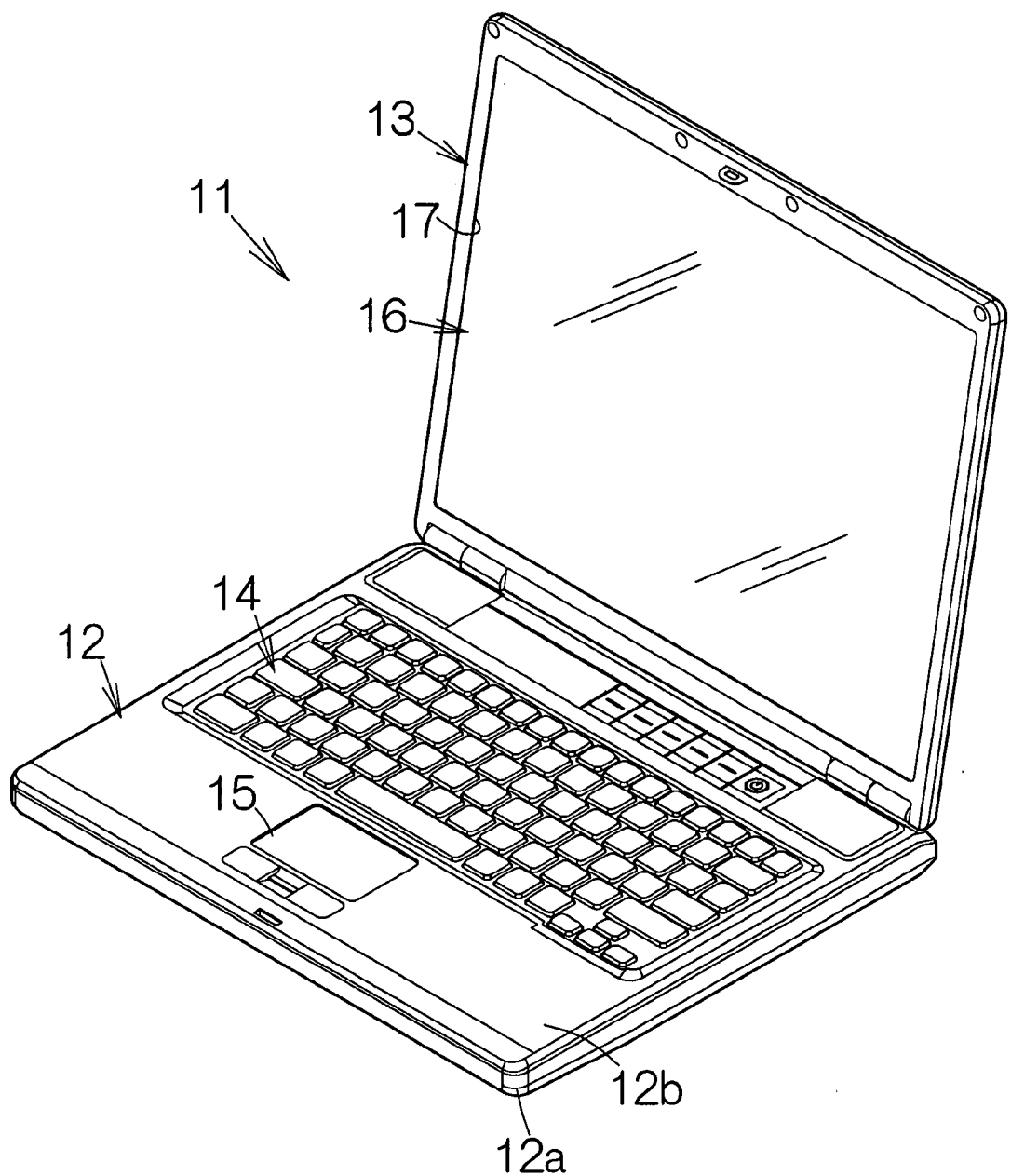
FIG. 1 is a perspective view schematically illustrating a notebook personal computer as a specific example of an electronic apparatus according to a first embodiment of the present invention.

FIG. 1 schematically illustrates a notebook personal computer 11 as a specific example of an electronic apparatus according to a first embodiment of the present invention. The notebook personal computer 11 includes a thin first enclosure, namely a main body enclosure 12, and a second enclosure, namely a display enclosure 13. The display enclosure 13 is coupled to the main body enclosure 12 for relative swinging movement. The main body enclosure 12 includes a base 12a and a cover 12b removably coupled to the base 12a. Input devices such as a keyboard 14 and a pointing device 15 are embedded in the surface of the cover 12b, for example. Users manipulate the keyboard 14 and/or the pointing device 15 to input commands and/or data.

A liquid crystal display (LCD) panel module 16 is enclosed in the display enclosure 13, for example. The screen of the LCD panel module 16 exposes within a window opening 17 defined in the display enclosure 13. Texts and graphics appear on the screen. Users can see the ongoing operation of the notebook personal computer 11 based on the texts and graphics on the screen. The display enclosure 13 can be superposed on the main body enclosure 12 through the swinging movement relative to the main body enclosure 12.

Figure 2:
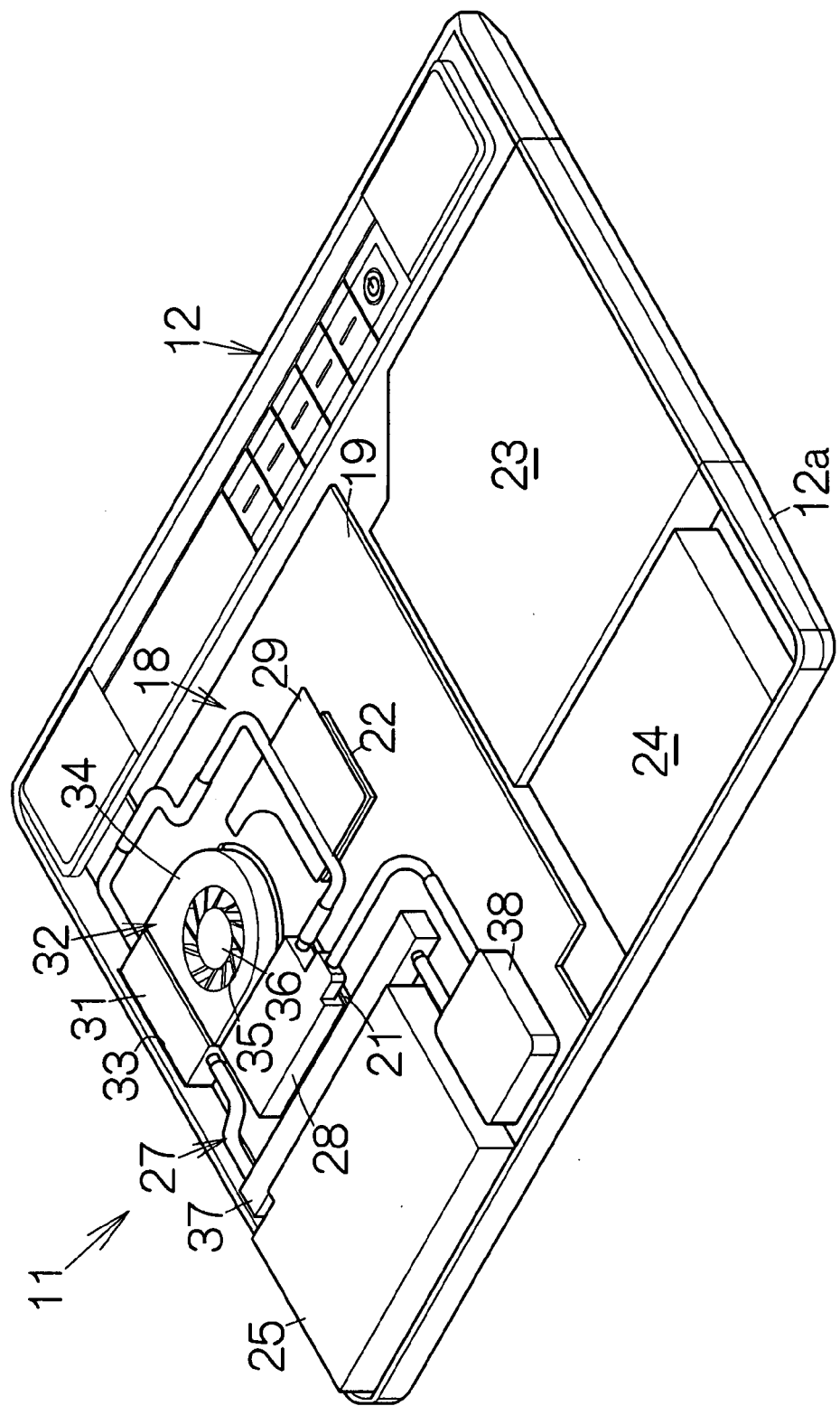
FIG. 2 is a perspective view schematically illustrating the inner structure of the notebook personal computer.

As shown in FIG. 2, a printed circuit board unit 18 is placed in the inner space defined in the main body enclosure 12. The printed circuit board unit 18 includes a printed wiring board 19 and electronic components, namely first and second large-scale integrated circuit (LSI) packages 21, 22, mounted on the surface of the printed wiring board. The first LSI package 21 includes a central processing unit (CPU) chip, not shown, mounted on a small-sized substrate, for example. The second LSI package includes a video chip, not shown, mounted on a small-sized substrate, for example. The CPU chip is designed to execute various kinds of processing based on an operating system (OS) and/or application software, for example. The video chip is designed to execute image processing based on the processing of the CPU chip, for example.

Storage medium drives or storage devices, such as digital versatile disk (DVD) drive 23 and a hard disk drive, HDD, 24, are placed in the inner space of the main body enclosure 12 at a position outside the printed wiring board 19. The aforementioned operating system and application software may be stored in the hard disk drive 24. A card unit 25 is placed in the inner space of the main body enclosure 12. PC cards, such as a memory card, a small computer system interface (SCSI) card and a local area network (LAN) card, are inserted into the card unit 25 through the card slot. The card unit 25 may be mounted on the printed wiring board 19, for example.

A liquid cooling unit 27 is placed on the printed wiring board 19 in the inner space of the main body enclosure 12. The liquid cooling unit 27 includes a first heat receiver 28 received on the first LSI package 21. The first heat receiver 28 is designed to absorb heat generated in the CPU chip. Screws may be utilized to fix the first heat receiver 28 onto the printed wiring board 19, for example. The liquid cooling unit 27 allows establishment of a closed circulating loop for coolant. The first heat receiver 28 is inserted in the closed circulating loop. Here, antifreeze of propylene glycol series may be utilized as coolant, for example. The first heat receiver 28 will be described later in detail.

A second heat receiver 29 is inserted in the closed circulating loop. The second heat receiver 29 is received on the second LSI package 22. The second heat receiver 29 is located at a position downstream of the first heat receiver 28. The second heat receiver 29 includes a thermal conductive plate received on the video chip. The second heat receiver 29 absorbs heat from the video chip in this manner. The thermal conductive plate is coupled to a metallic tube, which will be described later. Screws may be utilized to fix the thermal conductive plate onto the printed wiring board 19, for example. The thermal conductive plate may be made of a metallic material having thermal conductivity, such as aluminum, for example.

A heat exchanger 31 is inserted in the closed circulating loop so as to absorb heat from coolant. The heat exchanger 31 is located at a position downstream of the second heat receiver 29. The heat exchanger 31 is opposed to a ventilation opening defined in a fan unit 32. Screws may be utilized to fix the heat exchanger 31 and the fan unit 32 onto the printed wiring board 19, for example. The heat exchanger 31 is placed between the fan unit 32 and an air outlet 33 defined in the main body enclosure 12. The fan unit 32 generates airflow sequentially running through the heat exchanger 31 and the air outlet 33. The heat exchanger 31 and the fan unit 32 will be described later in detail. The fan unit 32 may be placed within a recess formed in the printed wiring board 19.

The fan unit 32 includes a fan housing 34. The fan housing 34 defines a predetermined inner space. The air inlet 35 is formed in each of the top and bottom plates of the fan housing 34. The air inlets 35 spatially connect the inner space of the fan housing 34 to a space outside the fan housing 34. A fan 36 is placed in the inner space of the fan housing 34.

A tank 37 is inserted in the closed circulating loop. The tank 37 is located at a position downstream of the heat exchanger 31. The tank 37 may be made of a metallic material having thermal conductivity such as aluminum, for example. Screws may be utilized to fix the tank 37 onto the printed wiring board 19, for example. The tank 37 serves to store the coolant and air in the closed circulating loop. The coolant and air are kept in a storage space defined in the tank 37. A coolant outlet is defined in the storage space. The coolant outlet is set at a position closest to the bottom of the storage space. Even if the coolant is leaked out of the circulating loop because of evaporation, for example, the gravity makes the coolant kept on the bottom of the storage space. Only the coolant is allowed to flow into the coolant outlet, so that air is prevented from reaching an outlet nozzle, which will be described later in detail.

A pump 38 is inserted in the closed circulating loop. The pump 38 is located at a position downstream of the tank 37. The first heat receiver 28 is located at a position downstream of the pump 38. Screws may be utilized to fix the pump 38 onto the printed wiring board 19. A piezoelectric pump may be utilized as the pump 38, for example. A piezoelectric element is incorporated in the piezoelectric pump. When the piezoelectric element vibrates in response to supply of electric power, the coolant is discharged from the pump 38 to the first heat receiver 28. The pump 38 allows the circulation of the coolant through the closed circulating loop in this manner. The pump 38 may be made of a resin material having a relatively low liquid permeability, such as polyphenylene sulfide (PPS), for example. Alternatively, a cascade pump, a piston pump, or the like, may be utilized as the pump 38, for example.

Figure 3:
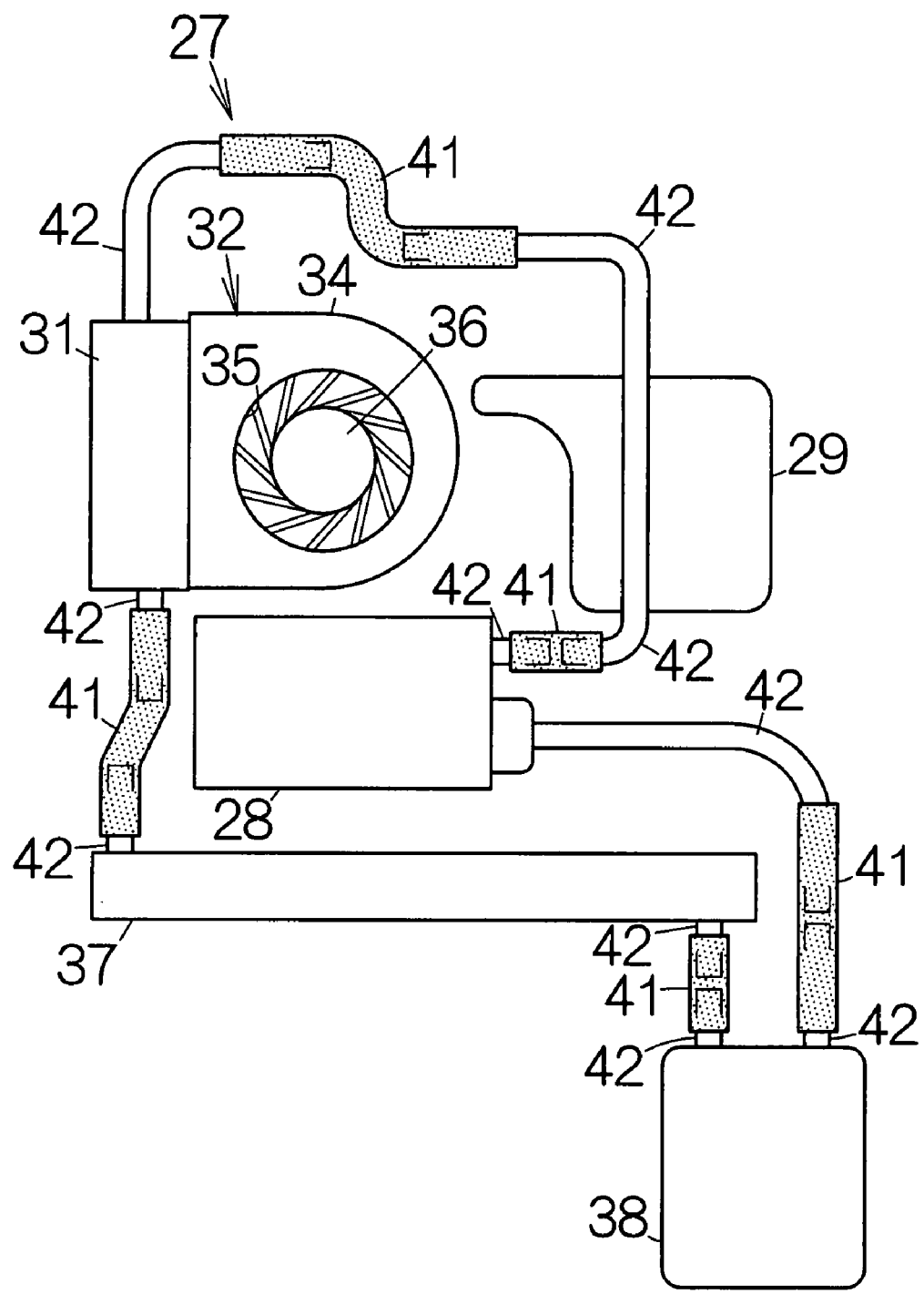
FIG. 3 is a plan view schematically illustrating a liquid cooling unit according to a specific embodiment of the present invention.

As shown in FIG. 3, a tube 41 is utilized for each connection between the first heat receiver 28 and the second heat receiver 29, between the second heat receiver 29 and the heat exchanger 31, between the heat exchanger 31 and the tank 37, between the tank 37 and the pump 38, and between the pump 38 and the first heat receiver 28. The ends of the tubes 41 are coupled to metallic tubes 42 attached to the first heat receiver 28, the second heat receiver 29, the heat exchanger 31, the tank 37 and the pump 38, respectively. Fixing members, not shown, such as bands, may be utilized to fix the tubes 41 onto the corresponding metallic tubes 42.

The tubes 41 may be made of an elastic resin material having flexibility, such as rubber, for example. The metallic tubes 42 may be made of a metallic material having thermal conductivity, such as aluminum, for example. The elasticity of the tubes 41 serves to absorb relative positional shifts between the first heat receiver 28, the second heat receiver 29, the heat exchanger 31, the tank 37 and the pump 38. The length of the respective tubes 41 may be set minimum enough to accept the relative positional shifts. Decoupling of the tubes 41 from the corresponding metallic tubes 42 allows independent replacement of the first heat receiver 28, the second heat receiver 29, the heat exchanger 31, the tank 37 and the pump 38 in a relatively facilitated manner.

Figure 4:
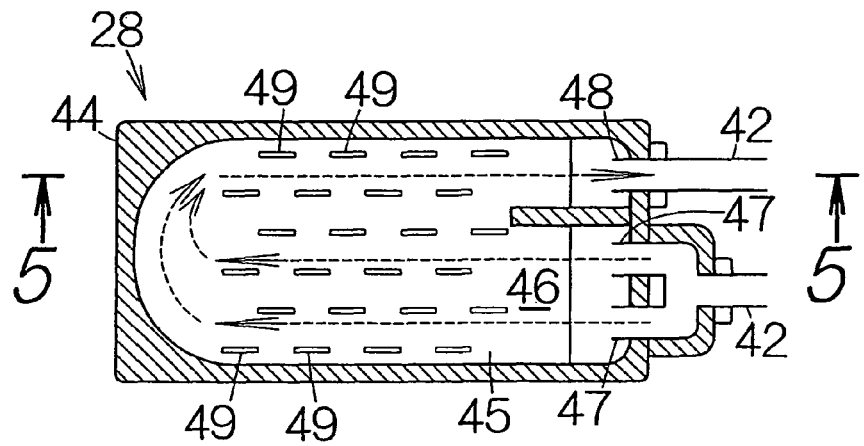
FIG. 4 is a sectional view schematically illustrating a heat receiver according to a specific example of the present invention.

As shown in FIG. 4, the first heat receiver 28 includes a box-shaped casing 44, for example. The casing 44 defines a closed inner space. The casing 44 may be made of a metallic material having thermal conductivity, such as aluminum, for example. The casing 44 includes a bottom plate defining a flat thermal conductive plate 45. A flow passage 46 is defined on the thermal conductive plate 45.

At least two inflow nozzles 47, 47 are coupled to the casing 44 at positions outside the periphery of the thermal conductive plate 45 so as to extend into the casing 44 from the outside. The inflow nozzles 47, 47 have discharge openings opposed to the upstream end of the flow passage 46. The inflow nozzles 47 may be formed in a cylindrical shape, for example. The inflow nozzles 47 may bifurcate from the metallic tube 42. The inflow nozzles 47, 47 are placed to extend along parallel lines. In this case, the inflow nozzles 47, 47 may be set in parallel with each other. The flow passage 46 is designed to extend on the extensions of the inflow nozzles 47.

An outflow nozzle 48 is coupled to the casing 44 at a position outside the periphery of the thermal conductive plate 45. The outflow nozzle 48 has an inflow opening opposed to the downstream end of the flow passage 46. The outflow nozzle 48 may be formed in a cylindrical shape, for example. The inflow nozzles 47 and the outflow nozzle 48 are oriented in the same direction. When the coolant flows into the flow passage 46 from the inflow nozzles 47, the coolant flows along the inner surface of the casing 44. The inner surface of the casing 44 allows the coolant to turn around. The coolant thus flows to the outflow nozzle 48 along the inner surface of the casing 44. The coolant is discharged from the outflow nozzle 48. The coolant absorbs heat from the thermal conductive plate 45. The flow passage 46 takes a U-shape in the casing 44 in this manner.

Heat radiating fins 49 are arranged on the thermal conductive plate 45 in a zigzag pattern. The heat radiating fins 49 stand upright from the surface of the thermal conductive plate 45. The heat radiating fins 49 are designed to extend in the direction of the coolant flow. The heat radiating fins 49 may be made of a metallic material having thermal conductivity, such as aluminum, for example. The heat radiating fins 49 may be formed integral with the thermal conductive plate 45, for example. Since the heat radiating fins 49 are arranged in a zigzag pattern, the aforementioned flow passage 46 is kept between the heat radiating fins 49 in the direction of the coolant flow. The coolant can flow through the flow passage 46 without stagnating. Heat is transmitted to the heat radiating fins 49 from the thermal conductive plate 45. The coolant absorbs the heat from the heat radiating fins 49.

Figure 5:
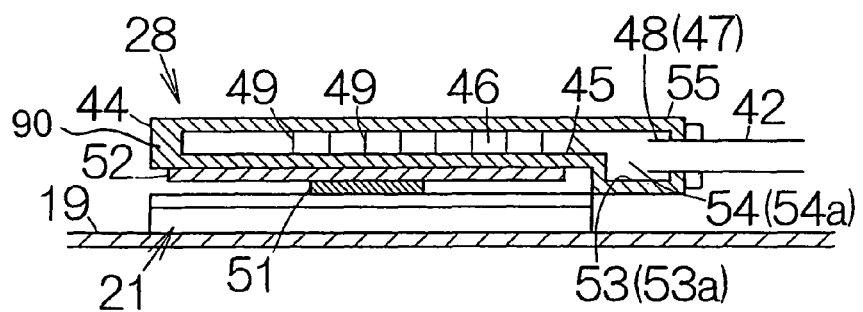
FIG. 5 is a sectional view taken along the line 5-5 in FIG. 4.

As shown in FIG. 5, the thermal conductive plate 45 is received on a CPU chip 51 in the first LSI package 21. The first LSI package 21 may be formed as a pin grid array (PGA) package. The first LSI package 21 may be received on a socket mounted on the printed wiring board 19, for example. A heat spreader 52 in the shape of a plate is interposed between the CPU chip 51 and the thermal conductive plate 45. The heat spreader 52 may be made of a metallic material having a high thermal conductivity, such as copper, for example. The heat spreader 52 serves to transfer heat of the CPU chip 51 to the thermal conductive plate 45 in an efficient manner.

The casing 44 includes a depression 53 sinking from the thermal conductive plate 45 between the downstream end of the flow passage 46 and the outflow nozzle 48. The depression 53 provides a space 54 having the level lower than the flow passage 46 in the casing 44. The outflow nozzle 48 is designed to extend into the space 54. The inflow opening of the outflow nozzle 48 is thus opposed to the peripheral edge of the thermal conductive plate 45. The casing 44 likewise defines a depression 53a sinking from the thermal conductive plate 45 between the upstream end of the flow passage 46 and the inflow nozzles 47, 47. The depression 53a provides a space 54a having the level lower than the flow passage 46 in the casing 44. The inflow nozzles 47, 47 are designed to extend into the space 54a. The openings of the inflow nozzles 47 are in this manner opposed to the peripheral edge of the thermal conductive plate 45. The casing 44 also defines a top plate 55. The top plate 55 is opposed to the thermal conductive plate 45 and the depressions 53, 53a, the top plate 55 and the thermal conductive plate 45 being connected by side wall 90.

The first heat receiver 28 allows establishment of the depressions 53, 53a between the downstream end of the flow passage 46 and the outflow nozzle 48 as well as between the upstream end of the flow passage 46 and the inflow nozzles 47, respectively. Specifically, the spaces 54, 54a are positioned outside the periphery of the thermal conductive plate 45, namely the first LSI package 21. The outflow and inflow nozzles 48, 47 are designed to extend into the spaces 54, 54a, respectively. The casing 44 is thus prevented from an increase in the thickness of the casing 44 as compared with the case where the inflow and outflow nozzles 47, 48 extends in the flow passage 46 inside the periphery of the first LSI package 21. This results in reduction in the height of the first heat receiver 28 from the front surface of the printed wiring board 19. The first heat receiver 28 having a reduced height significantly contributes to reduction in the thickness of the main body enclosure 12.

The thermal conductive plate 45 extends in the horizontal direction in the casing 44. Since the space 54 sinks from the flow passage 46, the gravity forces the coolant to flow into the space 54 from the flow passage 46. Even if the coolant is leaked out of the closed circulating loop because of evaporation from the tubes 41, the pump 38, and the like, for example, the coolant can constantly be maintained in the space 54. Even if air gets into the flow passage 46, the air goes up toward the top plate 55 in the space 54. The outflow nozzle 48 is thus prevented from sucking air as much as possible. This results in prevention of circulation of the air through the closed circulating loop.

Figure 6:
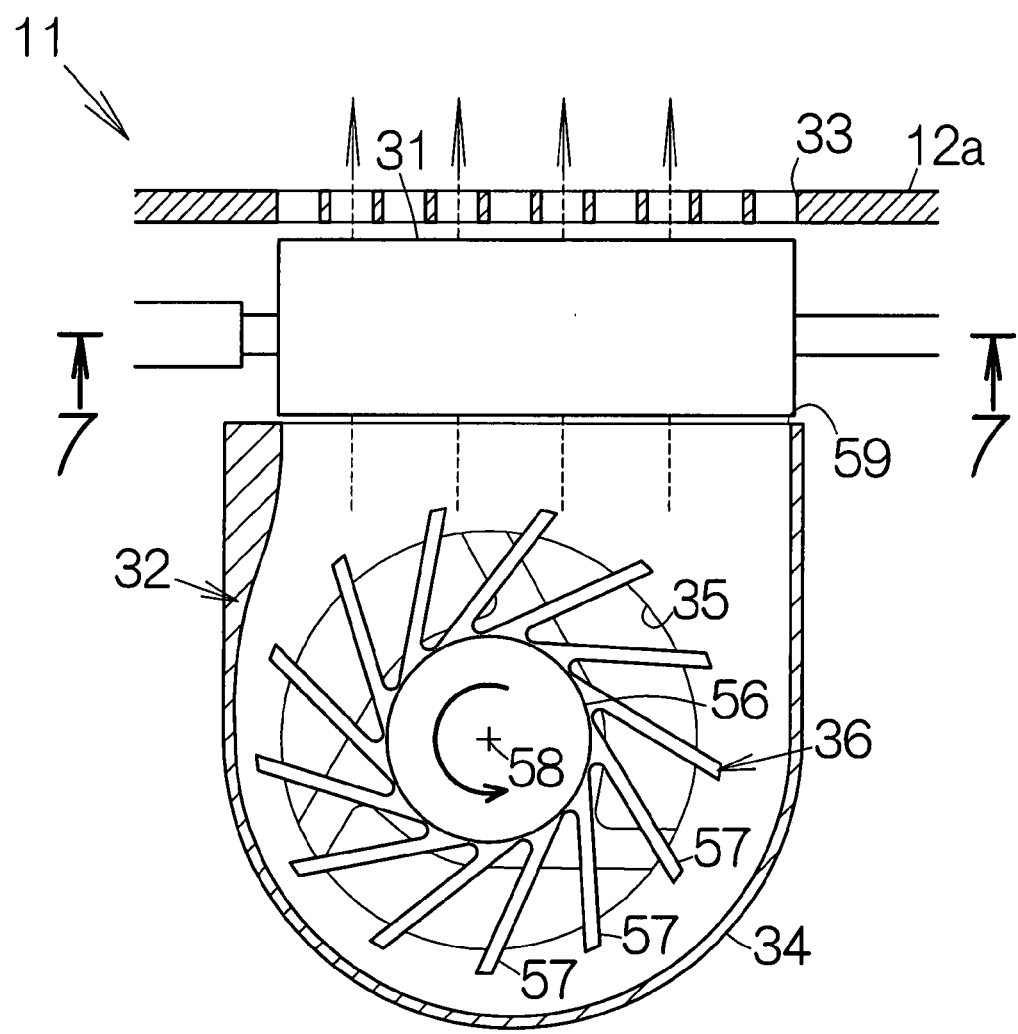
FIG. 6 is a partial sectional view schematically illustrating a fan unit.

As shown in FIG. 6, the fan 36 has the structure of a so-called centrifugal fan. The fan 36 includes a rotating body 56 and blades 57 extending outward in the radial directions from the rotating body 56. When the fan 36 is driven for rotation around a rotation axis 58, fresh air is introduced along the rotation axis 58 through the air inlets 35, 35 of the bottom and top plates of the fan housing 34. The rotation of the fan 36 serves to generate airflow running in the centrifugal direction.

A ventilation opening 59 is defined in the fan housing 34 at a position outside the orbit of the blades 57. The heat exchanger 31 is placed between the ventilation opening 59 and the air outlet 33. The centrifugal airflow is guided to the ventilation opening 59 along the inner surface of the fan housing 34. The air is discharged from the ventilation opening 59 in this manner. The discharged air sequentially runs through the heat exchanger 31 and the air outlet 33. The heat exchanger 31 is designed to extend in the direction perpendicular to the direction of the airflow.

Figure 7:
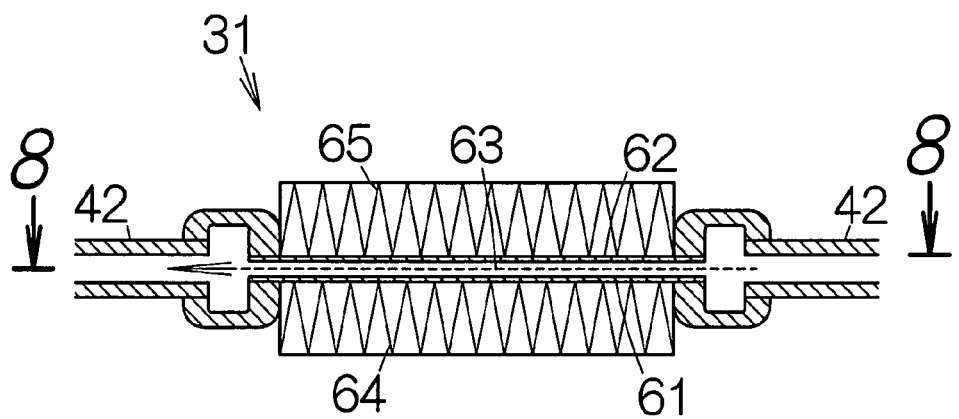
FIG. 7 is a sectional view taken along the line 7-7 in FIG. 6, for schematically illustrating a heat exchanger according to a specific example of the present invention.

As shown in FIG. 7, the heat exchanger 31 includes a first flat plate 61 extending in parallel with the bottom surface of the base 12a. A second flat plate 62 is opposed to the front surface of the first flat plate 61. The second flat plate 62 extends in parallel with the first flat plate 61. The peripheral edges of the first and second flat plates 61, 62 are coupled to each other. A flat space 63 is in this manner defined between the first and second flat plates 61, 62 along the front surface of the first flat plate 61. The flat space 62 serves as a flow passage. The flat space 63 is designed to extend along an imaginary plane including the longitudinal axis of the metallic tube 42. The first and second flat plates 61, 62 are made of a metallic material having thermal conductivity, such as aluminum, for example.

First heat radiating fins 64 are formed to stand upright from the outer surface of the first flat plate 61. Second heat radiating fins 65 are likewise formed to stand upright from the outer surface of the second flat plate 62. The first and second heat radiating fins 64, 65 are designed to extend from the ventilation opening 59 of the fan unit 32 to the air outlet 33. Airflow passages are defined between the adjacent first heat radiating fins 64, 64 and between the adjacent second heat radiating fins 65, 65. The airflow runs through the airflow passages along the outer surfaces of the first and second flat plates 61, 62. The first and second heat radiating fins 64, 65 are made of a metallic material having thermal conductivity, such as aluminum, for example.

Figure 8:
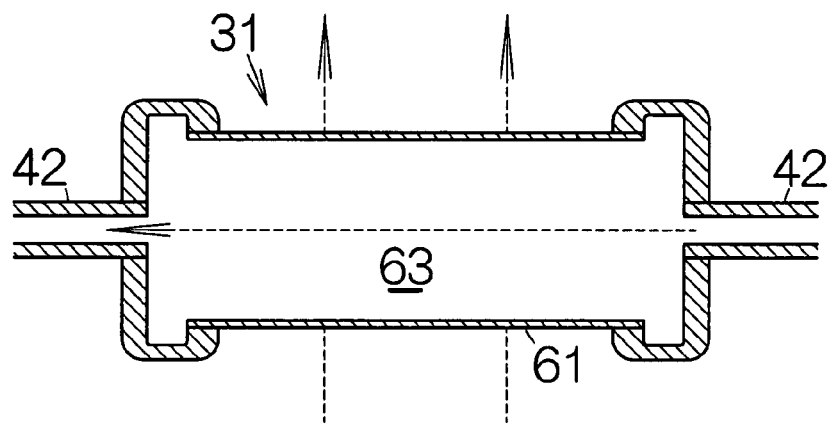
FIG. 8 is a sectional view taken along the line 8-8 in FIG. 7.

As shown in FIG. 8, the flat space 63 extends wide in the horizontal direction. The flat space 63 thus provides a flow passage having a sufficiently large cross-section as compared with the cross-section of the metallic tube 42. The flow speed of the coolant is suppressed at the flat space 63. The coolant is allowed to flow through the flat space 63 at a relatively low speed in this manner. The coolant thus contacts the first and second flat plates 61, 62 for a relatively longer time. The heat of the coolant can sufficiently be transferred to the first and second flat plates 61, 62. The airflow can absorb the heat of the coolant in an efficient manner.

Now, assume that the coolant circulates along the closed circulating loop. Antifreeze of propylene glycol series, for example, is utilized as the coolant as described above. When the notebook personal computer 11 is switched on, the CPU chip 51 starts the operation of the fan unit 32. The fan 36 is driven for rotation. Fresh air is introduced through an air inlet, not shown, formed in the main body enclosure 12. The air is introduced along the rotation axis 58 through the air inlets 35. The airflow thus runs along the front and back surfaces of the printed wiring board 19. Simultaneously, the CPU chip 51 directs the operation of the pump 38. The circulation of the coolant is thus generated in the closed circulating loop.

The CPU chip 51 generates heat of a first calorific power or a higher thermal energy during the operation of the CPU chip 51. The heat of the CPU chip 51 is transferred to the thermal conductive plate 45 and the heat radiating fins 49 of the first heat receiver 28. The coolant in the flow passage 46 absorbs the heat of the thermal conductive plate 45 and the heat radiating fins 49. The coolant flows into the flow passage 46 through the inflow nozzles 47, 47. Two streams of the coolant are generated in the flow passage 46 in this manner. The streams expand in the horizontal direction in the flow passage 46. The coolant flows through the flow passage 46 without stagnating. The coolant can absorb the heat of the thermal conductive plate 45 in an efficient manner. The CPU chip 51 gets cooled in this manner.

The coolant flows from the first heat receiver 28 to the second heat receiver 29. The video chip generates heat of a second calorific power smaller than the first calorific power, namely a lower thermal energy, during the operation of the video chip. The heat of the video chip is transferred to the thermal conductive plate of the second heat receiver 29. The coolant in the metallic tube 42 absorbs the heat of the thermal conductive plate. The video chip gets cooled in this manner. The coolant flows into the heat exchanger 31 from the second heat receiver 29. In this case, the video chip generates heat of the second calorific power smaller than the first calorific power of heat generated at the CPU chip 51. The coolant is first subjected to cooling action of the CPU chip 51 having a larger thermal energy. The CPU chip 51 and the video chip can thus be cooled in an efficient manner.

The coolant flows into the flat space 63 in the heat exchanger 31. The heat of the coolant is transferred to the first and second flat plates 61, 62 as well as the first and second heat radiating fins 64, 65. The fan unit 32 generates airflow from the ventilation opening 59 to the air outlet 33. The heat of the coolant is radiated into the air from the outer surfaces of the first and second flat plates 61, 62 and the surfaces of the first and second heat radiating fins 64, 65. The coolant thus gets cooled. The air is discharged out of the main body enclosure 12 through the air outlet 33. The coolant flows into the tank 37. The coolant then flows into the pump 38 from the tank 37.

The liquid cooling unit 27 of the notebook personal computer 11 is placed within the inner space of the main body enclosure 12. No component of the liquid cooling unit 27 is incorporated in the display enclosure 13. Accordingly, no tube 41 and no metallic tube 42 extend between the main body enclosure 12 and the display enclosure 13. The liquid cooling unit 27 can be assembled into the main body enclosure 12 in a relatively facilitated manner in the process of making the notebook personal computer 11. This results in reduction in the cost of making the notebook personal computer 11. The liquid cooling unit 27 is also removed from the main body enclosure 12 in a relatively facilitated manner.

In addition, when the notebook personal computer 11 is placed on the desk, the main body enclosure 12 is set on the desk, for example. As is apparent from FIG. 1, the main body enclosure 12 takes the horizontal attitude. The display enclosure 13 takes an inclined attitude around the edge of the main body enclosure 12. Since the liquid cooling unit 27 is incorporated in the main body enclosure 12, the weight of the liquid cooling unit 27 serves to locate the centroid of the notebook personal computer 11 at a lower position. The notebook personal computer 11 is thus allowed to enjoy a stabilized attitude.

In addition, the first heat receiver 28, the second heat receiver 29, the heat exchanger 31, the tank 37 and the metallic tubes 42 are all made of aluminum in the liquid cooling unit 27. The coolant is thus prevented from contacting with any metallic material other than aluminum in the closed circulating loop. The coolant is prevented from suffering from elution of metallic ions. This results in prevention of corrosion of the first heat receiver 28, the second heat receiver 29, the heat exchanger 31, the tank 37 and the metallic tubes 42. The coolant is in this manner prevented from leakage from the closed circulating loop.

In addition, the first and second flat plates 61, 62 of the heat exchanger 31 are allowed to contact with the first and second heat radiating fins 64, 65 at larger areas as compared with the case where a cylindrical tube is utilized to define the flow passage. This results in an enhanced efficiency of heat radiation. Moreover, the flat space 63 is designed to expand along an imaginary plane including the longitudinal axis of the metallic tube 42. Even when the coolant flows in a reduced amount, the coolant is allowed to contact the first and second flat plates 61, 62 over a larger area. This results in a further enhanced efficiency of heat radiation.

Figure 9:
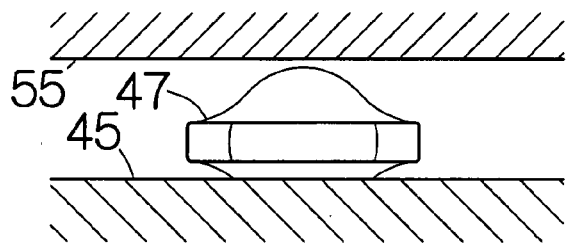
FIG. 9 is a front schematic view of an inflow nozzle.

As shown in FIG. 9, the tip ends of the inflow nozzles 47 may expand in the horizontal or lateral direction in the first heat receiver 28, for example. In this case, the tip ends of the inflow nozzles 47 may expand in a direction parallel to the thermal conductive plate 45 and the top plate 55. The inflow nozzles 47 allow the coolant to expand in the horizontal direction in the flow passage 46 through the tip ends of the inflow nozzles 47. The stream of the coolant is allowed to further expand in the horizontal direction in the flow passage 46. The coolant absorbs heat from the thermal conductive plate 45 and the heat radiating fins 49 in a highly efficient manner.

Figure 10:
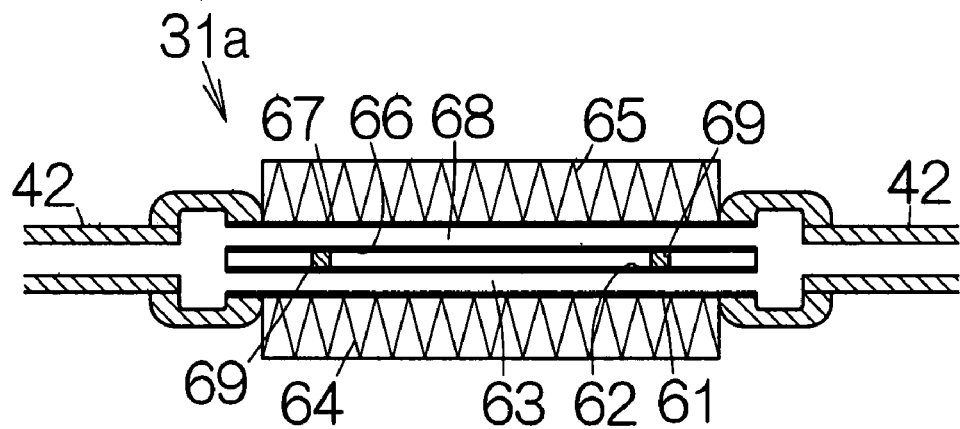
FIG. 10 is a sectional view, corresponding to FIG. 7, schematically illustrating a heat exchanger according to another specific example of the present invention.

As shown in FIG. 10, the liquid cooling unit 27 may include a heat exchanger 31a in place of the aforementioned heat exchanger 31. The heat exchanger 31a includes third and fourth flat plates 66, 67 in addition to the aforementioned first and second flat plates 61, 62. The third flat plate 66 is opposed to the front surface of the second flat plate 62. The fourth flat plate 67 is opposed to the front surface of the third flat plate 66. The peripheral edges of the third and fourth flat plates 66, 67 are coupled to each other. A flat space 68 is defined between the third and fourth flat plates 66, 67 along the front surface of the third flat plate 66 in this manner. The flat space 68 serves as a flow passage. The third and fourth flat plates 66, 67 are made of a metallic material having thermal conductivity, such as aluminum, for example.

The first heat radiating fins 64 are formed to stand upright from the outer surface of the first flat plate 61 in the same manner as the aforementioned heat exchanger 31. The second heat radiating fins 65 are likewise formed to stand upright from the outer surface of the fourth flat plate 67. A gap is defined between the front surface of the second flat plate 62 and the back surface of the third flat plate 66 in this manner. This gap serves as an airflow passage extending from the ventilation opening 59 of the fan unit 32 to the air outlet 33.

Support columns 69, 69 are placed in the gap between the front surface of the second flat plate 62 and the back surface of the third flat plate 66. The support columns 69 are interposed between the second and third flat plates 62, 66. The support columns 69 serve to maintain the gap between the second and third flat plates 62, 66. Even when an urging force is applied to the first and second flat plates 61, 62 toward the third and fourth flat plates 66, 67, or even when an urging force is applied to the third and fourth flat plates 66, 67 toward the first and second flat plates 61, 62, during the process of making the heat exchanger 31a, the first to fourth flat plates 61, 62, 66, 67 is reliably prevented from deformation. This results in prevention of reduction in the cross-section of the gap between the second flat plate 62 and the third flat plate 66.

The heat exchanger 31a allows establishment of the parallel flat spaces 63, 68. The coolant flows through the flat spaces 63, 68. The cross-section of the flow passage can be increased as compared with the aforementioned heat exchanger 31. This results in a reduction in the flow speed of the coolant. The coolant is allowed to flow through the flat spaces 63, 68 at a lower speed. The coolant contacts with the first and second flat plates 61, 62 and the third and fourth flat plates 66, 67 for a longer time. The heat of the coolant can thus sufficiently be transferred to the first and second flat plates 61, 62 and the third and fourth flat plates 66, 67. The airflow absorbs the heat from the coolant in an efficient manner.

Moreover, the airflow runs through the gap defined between the second and third flat plates 62, 66. The airflow runs along the front surface of the second flat plate 62 and the back surface of the third flat plate 66. The heat is radiated into the air from the front surface of the second flat plate 62 and the back surface of the third flat plate 66. This results in an enhanced efficiency of heat radiation as compared with the aforementioned heat exchanger 31.

Figure 11:
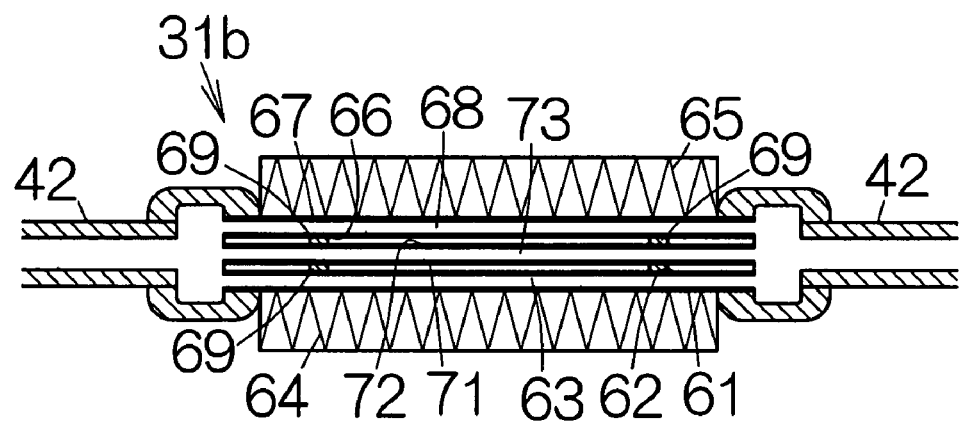
FIG. 11 is a sectional view, corresponding to FIG. 7, schematically illustrating a heat exchanger according to still another specific example of the present invention.

As shown in FIG. 11, the liquid cooling unit 27 may include a heat exchanger 31b in place of the aforementioned heat exchangers 31, 31a. The heat exchanger 31b includes fifth and sixth flat plates 71, 72 in addition to the first and second flat plates 61, 62 and the third and fourth flat plates 66, 67 of the heat exchanger 31a. The fifth flat plate 71 is opposed to the front surface of the second flat plate 62. The sixth flat plate 72 is opposed to the front surface of the fifth flat plate 71. The sixth flat plate 72 is also opposed to the back surface of the third flat plate 66. The peripheral edges of the fifth and sixth flat plates 71, 72 are coupled to each other. A flat space 73 is defined between the fifth and sixth flat plates 71, 72 along the front surface of the fifth flat plate 71. The flat space 73 serves as a flow passage. The fifth and sixth flat plates 71, 72 are made of a metallic material having thermal conductivity, such as aluminum, for example.

The first heat radiating fins 64 are formed to stand upright from the outer surface of the first flat plate 61 in the same manner as the aforementioned heat exchanger 31a. The second heat radiating fins 65 are formed to stand upright from the outer surface of the fourth flat plate 67. A gap is defined between the front surface of the second flat plate 62 and the back surface of the fifth flat plate 71. A gap is also defined between the front surface of the sixth flat plate 72 and the back surface of the third flat plate 66. These gaps serve as airflow passages extending from the ventilation opening 59 of the fan unit 32 to the air outlet 33. The support columns 69, 69 may be placed in each of the gaps in the same manner as described above.

Three of the flat spaces 63, 68, 73 are defined along parallel lines in the heat exchanger 31b. The coolant flows through the flat spaces 63, 68, 73. The cross-section of the flow passage is increased as compared with the aforementioned heat exchangers 31, 31a. The coolant is allowed to flow through the flat spaces 63, 68, 73 at a still lower speed. The airflow absorbs the heat from the coolant in an efficient manner in the same manner as described above. The flow speed of the coolant can be adjusted depending on the number of the flat spaces 63, 68, 73 in the heat exchangers 31, 31a, 31b. In addition, the airflow runs across the gaps. This results in a further enhanced efficiency of heat radiation as compared with the aforementioned heat exchangers 31, 31a.

Figure 12:
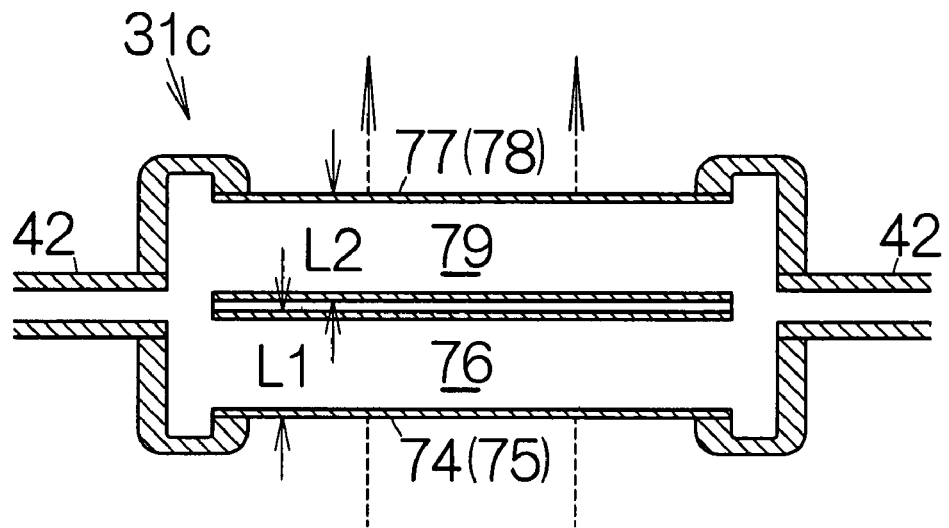
FIG. 12 is a sectional view, corresponding to FIG. 8, schematically illustrating a heat exchanger according to still another specific example of the present invention.

As shown in FIG. 12, the liquid cooling unit 27 may include a heat exchanger 31c in place of the aforementioned heat exchangers 31, 31a, 31b. The first and second flat plates 61, 62 of the aforementioned heat exchanger 31 are divided to extend in parallel with each other in the direction of the coolant flow in the heat exchanger 31c. Specifically, the heat exchanger 31c includes a first flat plate 74 extending along a reference plane, and a second flat plate 75 opposed to the front surface of the first flat plate 74. A flat space 76 is defined between the first and second flat plates 74, 75. The flat space 76 serves as a flow passage. The first and second flat plates 74, 75 are made of a metallic material having thermal conductivity, such as aluminum, for example.

Likewise, the heat exchanger 31c includes a third flat plate 77 and a fourth flat plate 78 opposed to the front surface of the third flat plate 77. The third flat plate 77 is designed to extend along the aforementioned reference plane. A flat space 79 is defined between the third and fourth flat plates 77, 78. The flat space 79 serves as a flow passage. The flat space 79 is designed to extend in parallel with the flat space 76. In this case, the length L1 of the flat space 76 defined in the direction of the airflow from the ventilation opening 59 to the air outlet 33 may be set equal to the length L2 of the flat space 79 likewise defined. The third and fourth flat plates 77, 78 are made of a metallic material having thermal conductivity, such as aluminum, for example.

Figure 13:
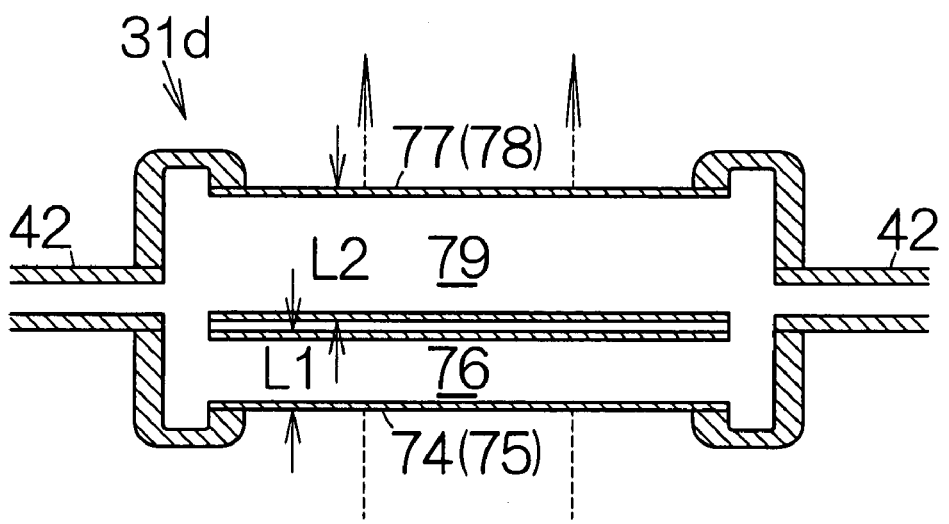
FIG. 13 is a sectional view, corresponding to FIG. 8, schematically illustrating a heat exchanger according to still another specific example of the present invention.

As shown in FIG. 13, the liquid cooling unit 27 may utilize a heat exchanger 31d in place of the heat exchanger 31c. The lengths L1, L2 of the flat spaces 76, 79 of the aforementioned heat exchanger 31c are changed in the heat exchanger 31d. Here, the length L2 of the flat space 79 may be set larger than the length L1 of the flat space 76. Alternatively, the length L2 of the flat space 79 may be set smaller than the length L1 of the flat space 76.

Figure 14:
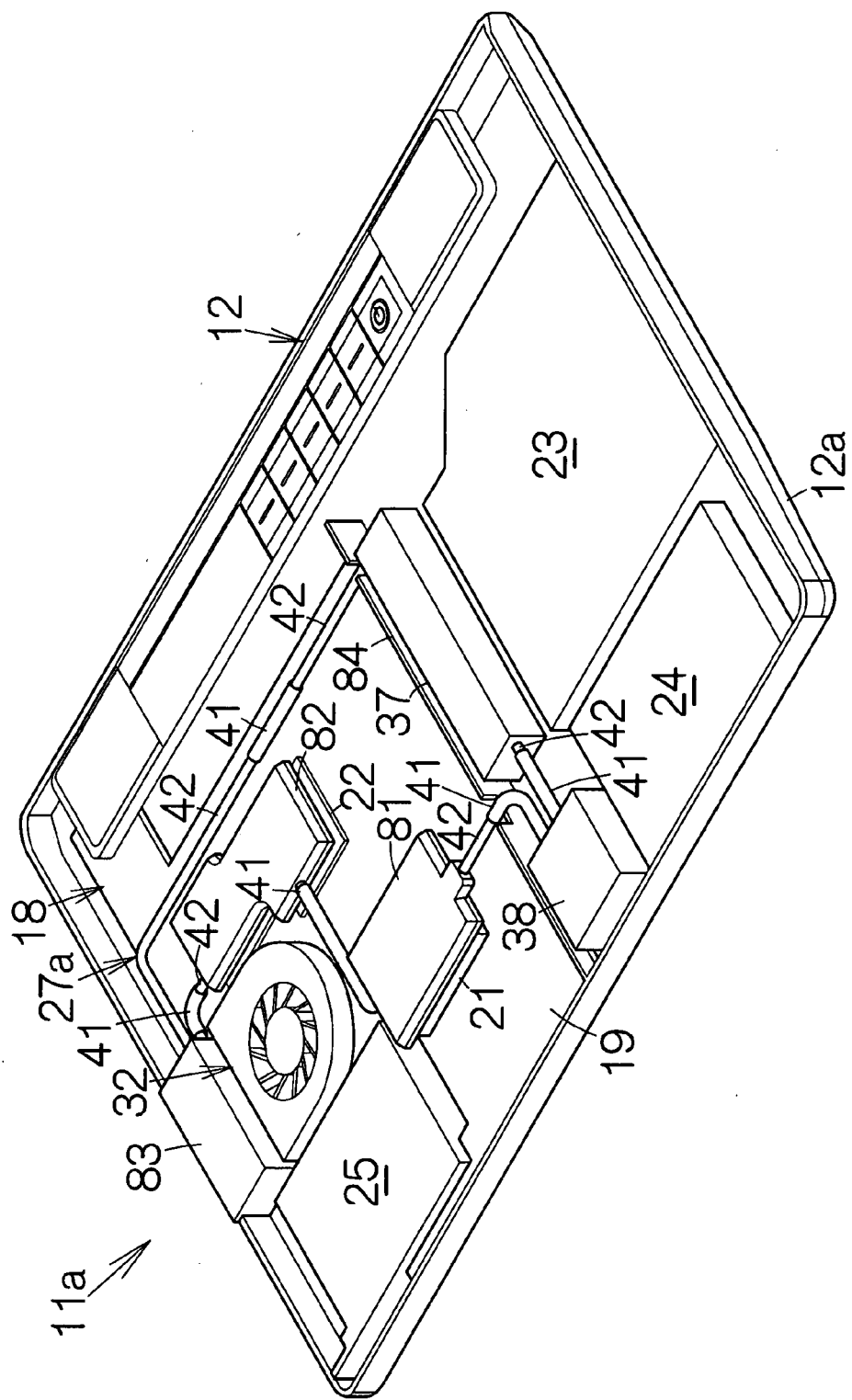
FIG. 14 is a perspective view schematically illustrating the inner structure of a notebook personal computer according to a second embodiment of the present invention.

FIG. 14 schematically illustrates the inner structure of a notebook personal computer 11a as a specific example of an electronic component according to a second embodiment of the present invention. The notebook personal computer 11a includes a liquid cooling unit 27a placed in the inner space of the main body enclosure 12. The liquid cooling unit 27a includes a first heat receiver 81, a second heat receiver 82 and a heat exchanger 83 in place of the aforementioned first heat receiver 28, second heat receiver 29 and heat exchanger 31. A closed circulating loop is established in the liquid cooling unit 27a. The first heat receiver 81 is inserted in the closed circulating loop. Like reference numerals are attached to the structure or components equivalent to those of the aforementioned notebook personal computer 11.

The fan unit 32 of the liquid cooling unit 27a is placed outside the closed circulating loop. The tank 37 and the pump 38 are placed outside the periphery of the printed wiring board 19. The tank 37 is placed between the printed wiring board 19 and the DVD drive 23. The pump 38 is placed between the printed wiring board 19 and the hard disk drive 24. Screws may be utilized to fix the tank 37 and the pump 38 onto the bottom plate of the base 12a, for example. It should be noted that an opening, not shown, may be formed in the bottom plate of the base 12a, for example. In this case, the tank 37 and the pump 38 can be replaced through the opening of the bottom plate.

A partition plate 84 is placed in a space between the printed wiring board 19 and the tank 37 as well as between the printed wiring board 19 and the pump 38. The partition plate 84 may stand upright from the bottom plate of the base 12a. The partition plate 84 serves to isolate a space containing the printed wiring board 19 from a space containing both the tank 37 and the pump 38. Movement of air is thus prevented between the space for the printed wiring board 19 and the space for both the tank 37 and the pump 38. The space for the tank 37 and the pump 38 can be prevented from receiving airflow that has absorbed heat from the first and second LSI packages 21, 22 in the space for the printed wiring board 19. The tank 37 and the pump 38 is thus prevented from a rise in the temperature. The coolant is prevented from evaporation in the pump 38.

Figure 15:
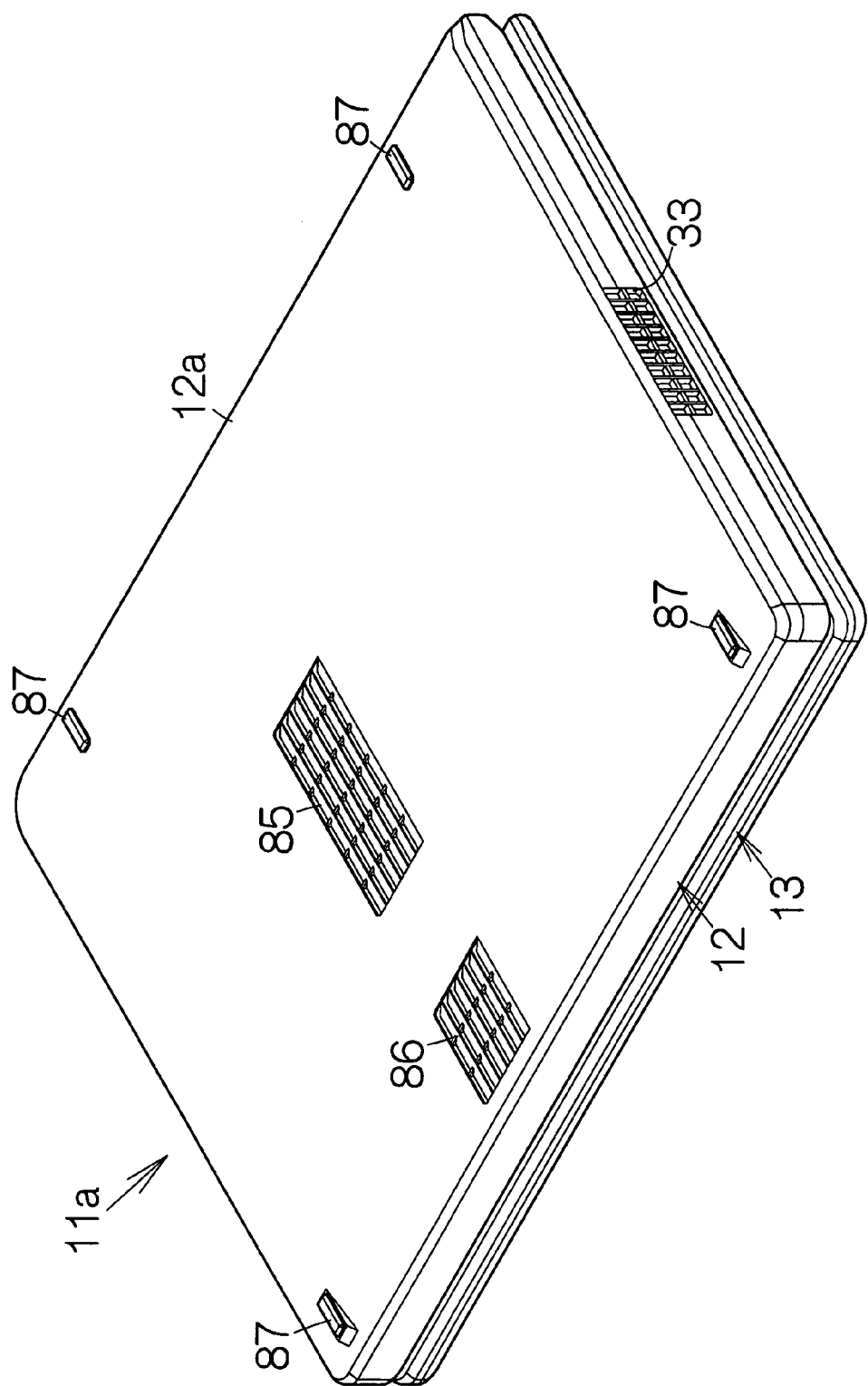
FIG. 15 is a perspective view schematically illustrating a main body enclosure.

As shown in FIG. 15, first and second air inlets 85, 86 are defined in the bottom plate of the base 12a. Fresh air is introduced into the inner space of the main body enclosure 12 from the outside through the first and second air inlets 85, 86. Here, the first air inlet 85 is opposed to the tank 37 in the inner space of the main body enclosure 12. The second air inlet 86 is opposed to the pump 38 in the inner space of the main body enclosure 12. The tank 37 and the pump 38 can be exposed to the fresh air outside the main body enclosure 12 in this manner. The first and second air inlets 85, 86 may be combined with each other in the bottom plate of the base 12a.

Pads 87 are formed on the four corners of the bottom surface of the main body enclosure 12. The pads 87 protrude from the bottom surface of the main body enclosure 12. The pads 87 may be made of an elastic resin material, such as rubber, for example. When the notebook personal computer 11a is placed on the desk, the main body enclosure 12 is received on the surface of the desk at the pads 87. The pads 87 serve to establish a gap between the bottom surface of the main body enclosure 12 and the surface of the desk. The first and second air inlets 85, 86 are thus prevented from being closed with the surface of the desk.

Figure 16:
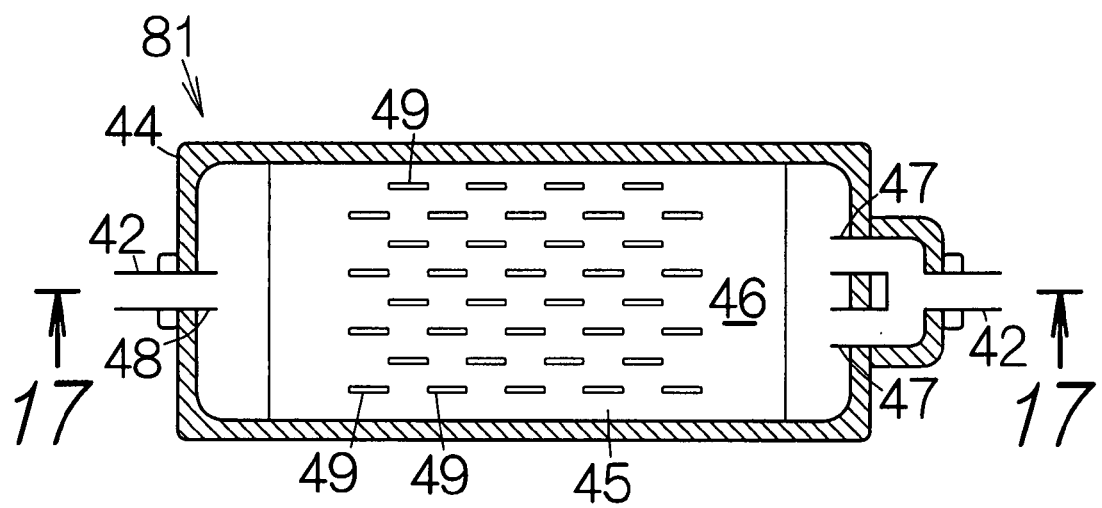
FIG. 16 is a sectional view, corresponding to FIG. 4, schematically illustrating a heat receiver according to a specific example of the present invention.
Figure 17:
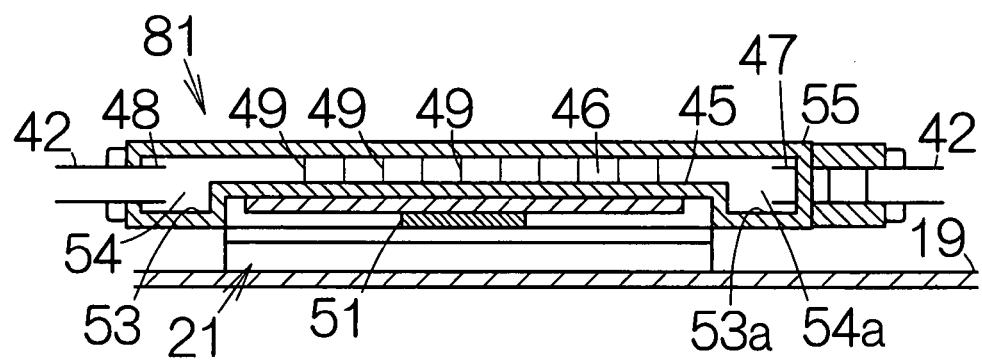
FIG. 17 is a sectional view taken along the line 17-17 in FIG. 16.

As shown in FIG. 16, the inflow nozzles 47, 47 and the outflow nozzle 48 are opposed to each other in the first heat receiver 81. The flow passage 46 thus extends straight from the inflow nozzles 47, 47 to the outflow nozzle 48 on the thermal conductive plate 45. As shown in FIG. 17, the inflow nozzles 47 are designed to extend into the space 54a. The outflow nozzle 48 is likewise designed to extend into the space 54. The inflow nozzles 47 and the outflow nozzle 48 are connected to the flow passage 46 at positions outside the periphery of the first LSI package 21 in the same manner as described above. This results in prevention of increase in the thickness of the casing 44.

Figure 18:
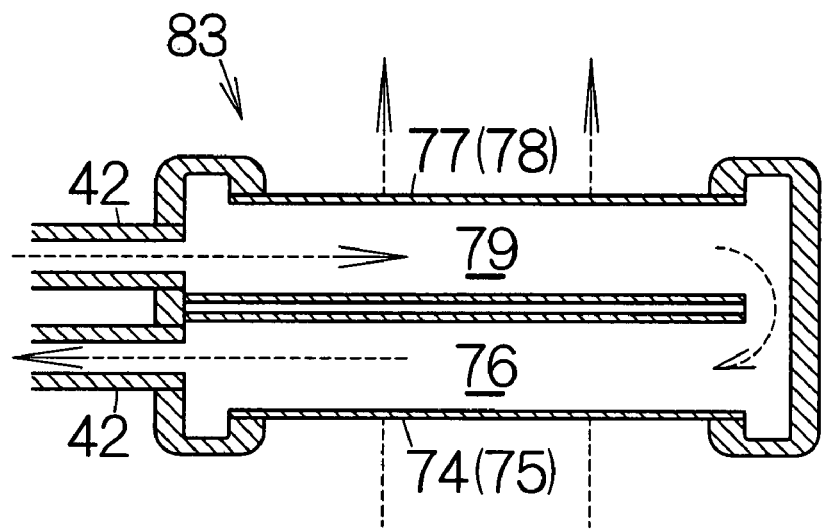
FIG. 18 is a sectional view, corresponding to FIG. 8, schematically illustrating a heat exchanger according to still another specific example of the present invention.

As shown in FIG. 18, the heat exchanger 83 defines the flat spaces 76, 79 extending along parallel lines in the same manner as the aforementioned heat exchanger 31c. A pair of parallel metallic tubes 42 is connected to one end of the heat exchanger 83. The coolant thus flows into one end of the flat space 79 through one of the metallic tubes 42. The coolant flows across the flat space 79 to one end of the flat space 76. The coolant flows into the other metallic tube 42 from the other end of the flat space 76. The coolant is allowed to contact with the first and second flat plates 74, 75 and the third and fourth flat plates 76, 77 for a longer time in this manner. Simultaneously, the flow passage is narrowed. The coolant is allowed to flow through the flow passage without stagnating. The airflow can absorb the heat of the coolant in an efficient manner.

When the flat spaces 76, 79 are defined to extend along parallel lines in the aforementioned manner, the heat exchanger 83 enables an intensive location of the metallic tubes 42, 42 at one end of the heat exchanger 83. No metallic tube 42 needs to be connected to the other end of the heat exchanger 83. This results in reduction in the size of the heat exchanger 83. In addition, the positions of the metallic tubes 42 can be changed depending on the positions of electronic components on the printed wiring board 19. The heat exchanger 83 contributes to realization of wide possibility for arrangement of electronic components in the inner space of the main body enclosure 12.

The pump 38 allows circulation of the coolant through the closed circulating loop in the notebook personal computer 11a in the same manner as the aforementioned notebook personal computer 11. Heat of the CPU chip 51 is transferred to the first heat receiver 81. Heat of the video chip is transferred to the second heat receiver 82. The temperature of the coolant thus rises. The coolant flows into the heat exchanger 83 from the second heat receiver 82. The heat of the coolant is radiated into the air through the heat exchanger 83. The coolant thus gets cooled. The airflow is discharged out of the main body enclosure 12 through the air outlet 33. The cooled coolant flows into the tank 37.

The heat of the CPU chip 51 and the video chip is also transferred to the printed wiring board 19. The heat spreads over the printed wiring board 19 through wiring patterns on the printed wiring board 19. Since the tank 37 and the pump 38 are placed outside the periphery of the printed wiring board 19, the tank 37 and the pump 38 are reliably prevented from receiving the heat from the printed wiring board 19. This results in prevention of rise in the temperature of the coolant in the tank 37 and the pump 38. The tank 37 and the pump 38 contribute to radiation of heat from the coolant into the inner space of the main body enclosure 12.

In addition, the tank 37 and the pump 38 are opposed to the first air inlet 85 and the second air inlet 86, respectively. Fresh air is introduced into the main body enclosure 12 through the first and second air inlets 85, 86. The tank 37 and the pump 38 are exposed to the fresh air. The heat of the coolant in the tank 37 and the pump 38 can be radiated into the fresh air from the tank 37 and the pump 38. The heat of the coolant can be radiated into the air not only at the heat exchanger 83 but also at the tank 37 and the pump 38. The coolant gets cooled in a highly efficient manner.

Figure 19:
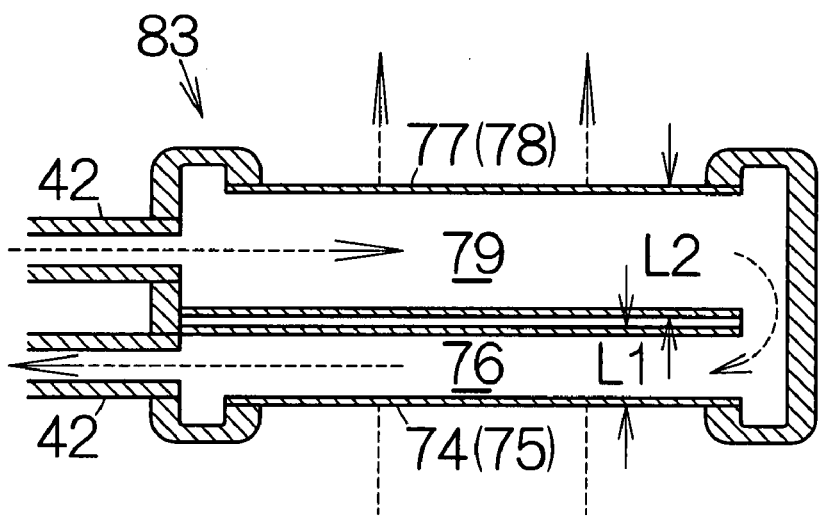
FIG. 19 is a sectional view, corresponding to FIG. 8, schematically illustrating a heat exchanger according to still another specific example of the present invention.

As shown in FIG. 19, the lengths L1, L2 of the flat spaces 76, 79 may be changed in the heat exchanger 83 in the same manner as in the heat exchanger 31d. In this case, the length L2 of the flat space 79 is set larger than the length L1 of the flat space 76. Alternatively, the length L2 of the flat space 79 may be set smaller than the length L1 of the flat space 76.

The liquid cooling units 27, 27a can be incorporated in electronic apparatuses other than the notebook personal computers 11, 11a, such as a personal digital assistant (PDA), a desktop personal computer, a server computer, and the like.

What is claimed is:

1. A heat receiver for a liquid cooling unit, comprising:
   a casing defining a flow passage on a planar thermal conductive plate, the casing including a bottom plate having a portion serving as the planar thermal conductive plate, a top plate extending in parallel with the planar thermal conductive plate and a side wall connecting a periphery of the bottom plate with a periphery of the top plate, the bottom plate further defining a depression adjacent to the planar thermal conductive plate for establishing a space in the casing connected to an upstream end of the flow passage, the depression having a bottom at a level lower than the flow passage;
   at least two inflow nozzles extending into the side wall of the casing along parallel lines, each of the at least two inflow nozzles protruding into the space so as to have a tubular discharge opening at a position downstream of an upstream end of the space and upstream of the upstream end of the flow passage, respectively; and
   a sole outflow nozzle extending into the casing, the sole outflow nozzle having an inflow opening facing a downstream end of the flow passage.

2. The heat receiver according to claim 1, wherein the flow passage extends on extensions of the at least two inflow nozzles.

3. The heat receiver according to claim 1, wherein each of the at least two inflow nozzles has a discharge opening facing towards an inflow opening of the sole outflow nozzle.

4. The heat receiver according to claim 1, wherein the at least two inflow nozzles and the sole outflow nozzle are oriented in a same direction.

5. The heat receiver according to claim 1, further comprising heat radiating fins standing from the planar thermal conductive plate, the heat radiating fins extending in a direction of a flow of a coolant, the heat radiating fins arranged in a zigzag pattern.

6. The heat receiver according to claim 1, wherein the flow passage extends straight from the at least two inflow nozzles to the sole outflow nozzle.

7. A liquid cooling unit comprising:
   a closed circulating loop;
   a heat receiver inserted in the closed circulating loop, the heat receiver having a planar thermal conductive plate received on an electronic component; and
   a heat exchanger inserted in the closed circulating loop so as to absorb heat from coolant, wherein the heat receiver includes:
      a casing defining a flow passage on the planar thermal conductive plate, the casing including a bottom plate having a portion serving as the planar thermal conductive plate, a top plate extending in parallel with the planar thermal conductive plan plate and a side wall connecting a periphery of the bottom plate with a periphery of the top plate, the bottom plate further defining a depression adjacent to the planar thermal conductive plate for establishing a space in the casing connected to an upstream end of the flow passage, the depression having a bottom at a level lower than the flow passage;

at least two inflow nozzles extending into the side wall of the casing along parallel lines, each of the at least two inflow nozzles protruding into the space so as to have a tubular discharge opening at a position downstream of an upstream end of the space and upstream of the upstream end of the flow passage, respectively; and a sole outflow nozzle extending into the casing, the sole outflow nozzle having an inflow opening facing a downstream end of the flow passage.

8. The liquid cooling unit according to claim 7, wherein the flow passage extends on extensions of the at least two inflow nozzles.

9. The liquid cooling unit according to claim 7, wherein each of the at least two inflow nozzles has a discharge opening facing towards an inflow opening of the sole outflow nozzle.

10. The liquid cooling unit according to claim 7, wherein the at least two inflow nozzles and the sole outflow nozzle are oriented in a same direction.

11. The liquid cooling unit according to claim 7, further comprising heat radiating fins standing from the planar thermal conductive plate, the heat radiating fins extending in a direction of a flow of the coolant, the heat radiating fins arranged in a zigzag pattern.

12. The liquid cooling unit according to claim 7, wherein the flow passage extends straight from the at least two inflow nozzles to the sole outflow nozzle.

13. An electronic apparatus comprising:

an electronic component;

a closed circulating loop;

a heat receiver inserted in the closed circulating loop, the heat receiver having a planar thermal conductive plate received on the electronic component; and a heat exchanger inserted in the closed circulating loop so as to absorb heat from a coolant, wherein the heat receiver includes:

a casing defining a flow passage on the planar thermal conductive plate, the casing including a bottom plate having a portion serving as the planar thermal conductive plate, a top plate extending in parallel with the planar thermal conductive plate and a side wall connecting a periphery of the bottom plate with a periphery of the top plate, the bottom plate further defining a depression adjacent to the planar thermal conductive plate for establishing a space in the casing connected to an upstream end of the flow passage, the depression having a bottom at a level lower than the flow passage;

at least two inflow nozzles extending into the side wall of the casing along parallel lines, each of the at least two inflow nozzles protruding into the space so as to have a tubular discharge opening at a position downstream of an upstream end of the space and upstream of the upstream end of the flow passage, respectively; and a sole outflow nozzle extending into the casing, the sole outflow nozzle having an inflow opening facing a downstream end of the flow passage.

14. The electronic apparatus according to claim 13, wherein the flow passage extends on extensions of the at least two inflow nozzles.

15. The electronic apparatus according to claim 13, wherein each of the at least two inflow nozzles has a discharge opening facing towards an inflow opening of the sole outflow nozzle.

16. The electronic apparatus according to claim 13, wherein the at least two inflow nozzles and the sole outflow nozzle are oriented in a same direction.

17. The electronic apparatus according to claim 13, further comprising heat radiating fins standing from the planar thermal conductive plate, the heat radiating fins extending in a direction of a flow of the coolant, the heat radiating fins arranged in a zigzag pattern.

18. The electronic apparatus according to claim 13, wherein the flow passage extends straight from the at least two inflow nozzles to the sole outflow nozzle.

\* \* \* \* \*

UNITED STATES PATENT AND TRADEMARK OFFICE
CERTIFICATE OF CORRECTION

| | | |
|---|---|---|
| PATENT NO. | : 8,289,701 B2 | Page 1 of 1 |
| APPLICATION NO. | : 11/878620 | |
| DATED | : October 16, 2012 | |
| INVENTOR(S) | : Masumi Suzuki et al. | |

It is certified that error appears in the above-identified patent and that said Letters Patent is hereby corrected as shown below:

On the Title Page, Item (73) (Assignee), Line 1, Delete "Fujistu" and insert -- Fujitsu --, therefor.
Column 14, Line 59, In Claim 7, delete "from" and insert -- from a --, therefor.
Column 14, Line 65, In Claim 7, delete "plan plate" and insert -- plate --, therefor.

Signed and Sealed this
Eighth Day of January, 2013

David J. Kappos
*Director of the United States Patent and Trademark Office*